(12) United States Patent
Noda et al.

(10) Patent No.: US 8,056,030 B2
(45) Date of Patent: Nov. 8, 2011

(54) BEHAVIORAL SYNTHESIS SYSTEM, BEHAVIORAL SYNTHESIS METHOD, AND BEHAVIORAL SYNTHESIS PROGRAM

(75) Inventors: Shinichi Noda, Minato-ku (JP); Hiroshi Akashio, Minato-ku (JP)

(73) Assignees: NEC Corporation, Tokyo (JP); NEC Information Systems, Ltd., Tokyo (JP)

( * ) Notice: Subject to any disclaimer, the term of this patent is extended or adjusted under 35 U.S.C. 154(b) by 328 days.

(21) Appl. No.: 12/277,728

(22) Filed: Nov. 25, 2008

(65) Prior Publication Data
US 2009/0138842 A1    May 28, 2009

(30) Foreign Application Priority Data
Nov. 27, 2007    (JP) .................................. 2007-306341

(51) Int. Cl.
*G06F 17/50* (2006.01)
(52) U.S. Cl. ..................... 716/104; 716/108; 716/134
(58) Field of Classification Search ................... 716/104
See application file for complete search history.

(56) References Cited

U.S. PATENT DOCUMENTS

| | | | | |
|---|---|---|---|---|
| RE40,925 E | * | 9/2009 | Ly et al. ........................ | 716/103 |
| 2002/0053069 A1 | * | 5/2002 | Ohnishi et al. ................. | 716/18 |

OTHER PUBLICATIONS

Knapp, D. et al., Behavioral Synthesis Methodology for HDL-Based Specification and Validation, 1995, Design Automation, 1995. DAC '95. 32nd Conference on, pp. 286-291.*
"Behavioral Synthesis: Digital System Design Using the Synopsis Behavioral Compiler", Jun. 1999, pp. 57-60, Prentice Hall.

* cited by examiner

*Primary Examiner* — Paul Dinh
*Assistant Examiner* — Bryce Aisaka
(74) *Attorney, Agent, or Firm* — Sughrue Mion, PLLC

(57) ABSTRACT

A behavioral synthesis system has a scheduling unit and a mode control unit. The scheduling unit performs scheduling of a behavioral level description with reference to a resource quantity data indicating resource constraint and a resource delay data indicating delay times of respective resources. A single process described in the behavioral level description is divided into a plurality of description blocks, and a scheduling mode among a plurality of scheduling modes is designated with respect to each of the plurality of description block. The mode control unit refers to a mode designation code that indicates the designated scheduling mode and controls such that the scheduling unit performs the scheduling with respect to each description block in accordance with the designated scheduling mode indicated by the mode designation code.

16 Claims, 12 Drawing Sheets

Fig. 5A

```
#pragma scheduling_block(superstate , io)
{
    #pragma scheduling_block(fixed , all)
    {
        do{
          wait();
        } while(ready.read()==0);
        wait();
        data1=data_in.read()+1;
        wait();
        data2=data_in.read()+1;
        wait();
        data3=data_in.read()+1;
        ack.write(1);
    }
    t1=data1+data2;
    t2=data2+data3;
    t3=data3+data1;
    out1.write(t1 * t2 * t3);
}
```

Fig. 5B

```
step1:
    goto step2;
step2:
    if(ready.read()==0)   goto step2;
    else                          goto step3;
step3:
   data1 = data_in.read() + 1;goto step4;
step4:
   data2 = data_in.read() + 1;goto step5;
step5:
    data3 = data_in.read()+1;
   ack.write(1);
```

Fig. 5C

```
step1:
    goto step2;
step2:
    if(ready.read()==0)   goto step2;
    else                            goto step3;
step3:
   data1 = data_in.read() + 1;goto step4;
step4:
   data2 = data_in.read() + 1;
   t1 = data1 + data2;   goto step5;
step5:
    data3 = data_in.read()+1;
   ack.write(1);
   t2 = data2 + data3;   goto step6;
step6:
   t3 = data3 + data1;
```

Fig. 5D

```
step1:
    goto step2;
step2:
    if(ready.read()==0)   goto step2;
    else                              goto step3;
step3:
   data1 = data_in.read() + 1;goto step4;
step4:
   data2 = data_in.read() + 1;
   t1 = data1 + data2;  goto step5;
step5:
    data3 = data_in.read()+1;
   ack.write(1);
   t2 = data2 + data3;  goto step6;
step6:
   t3 = data3 + data1;
   M_O1 = t1 * t2;  goto step7;
step7:
    M_O2 = M_O1 * t3;
    out1.write(M_O2);
```

Fig. 5E

```
step1:
    goto step2;
step2:
    if(ready.read()==0)  goto step2;
    else                          goto step3;
step3:
  data1 = data_in.read() + 1;goto step4;
step4:
  data2 = data_in.read() + 1;goto step5;
step5:
    data3 = data_in.read() + 1;
    ack.write(1);            goto step6;
step6:  //SCHEDULING ENGINE IS SWITCHED HERE
    t1 = data1 + data2;
    t2 = data2 + data3;    goto step7;
step7:
   M_01 = t1 * t2;
   t3 = data3 + data1;  goto step8;
step8:
    M_02 = M_01 * t3;
    out1.write(M_02);
```

BEHAVIORAL SYNTHESIS SYSTEM, BEHAVIORAL SYNTHESIS METHOD, AND BEHAVIORAL SYNTHESIS PROGRAM

INCORPORATION BY REFERENCE

This application is based upon and claims the benefit of priority from Japanese patent application No. 2007-306341, filed on Nov. 27, 2007, the disclosure of which is incorporated herein in its entirely by reference.

TECHNICAL FIELD

The present invention relates to a circuit design technique. In particular, the present invention relates to a behavioral synthesis system, a behavioral synthesis method, and a behavioral synthesis program.

BACKGROUND ART

In a recent design process of an integrated circuit, a designer describes the integrated circuit by using software in order to improve productivity. At an upstream phase of the design flow, the integrated circuit is described in a highly abstract behavioral level. A circuit data described in the behavioral level is referred to as a "behavioral level description file". A behavioral synthesis system performs a behavioral synthesis of the behavioral level description file to automatically generate a circuit data described in a register transfer level (referred to as an "RT level description file"). Then, a logic synthesis of the RT level description file is performed at the downstream phase. By the logic synthesis, a circuit data described in a gate level is generated and an implementation design of a logic circuit is performed.

In the behavioral synthesis processing by the behavioral synthesis system, "scheduling" for mapping operations to clock cycles, "binding" for allocating the operations to functional units such as a multiplier and an adder, and the like are executed. Here, some scheduling modes are known with regard to the "scheduling" in the behavioral synthesis. According to David W. Knapp, "Behavioral Synthesis: Digital System Design Using the Synopsis Behavioral Compiler", Prentice Hall, June 1999, pp. 57-60 (non-patent document 1), three scheduling modes: "cycle-fixed mode", "superstate input-output mode" and "free-floating mode" are cited. Information of a clock cycle is included in the behavioral level description file, and it is possible to designate a cycle boundary between clock cycles. The above-mentioned scheduling modes define a relationship between the cycle boundaries and a relationship between the cycle boundary and input-output (I/O).

Modules and processes included in the modules are described in the behavioral level description file. The behavioral synthesis can be performed by switching the scheduling mode with respect to each process as a unit. However, a plurality of scheduling modes have not been applied to a single process. One reason for that is that the behavioral synthesis system terminates a cycle in response to the switching of scheduling engine and thus the number of cycles unnecessarily increases even when the behavioral synthesis is performed. Currently, a designer cannot designate a different scheduling mode only to an arbitrary block within a single process described in the behavioral level.

SUMMARY

An exemplary object of the present invention is to provide a technique that achieves behavioral synthesis with applying a plurality of scheduling modes to a single process described in the behavioral level.

In an exemplary aspect of the invention, a behavioral synthesis system is provided. The behavioral synthesis system comprises a scheduling unit and a mode control unit. The scheduling unit performs scheduling of a behavioral level description with reference to a resource quantity data indicating resource constraint and a resource delay data indicating delay times of respective resources. A single process described in the behavioral level description is divided into a plurality of description blocks, and a scheduling mode among a plurality of scheduling modes is designated with respect to each of the plurality of description blocks. The mode control unit refers to a mode designation code that indicates the designated scheduling mode among the plurality of scheduling modes and controls such that the scheduling unit performs the scheduling with respect to each of the plurality of description blocks in accordance with the designated scheduling mode indicated by the mode designation code.

In another exemplary aspect of the invention, a behavioral synthesis method is provided. The behavioral synthesis method includes: (a) storing a behavioral level description in a storage device, wherein a single process described in the behavioral level description is divided into a plurality of description blocks and a scheduling mode among a plurality of scheduling modes is designated with respect to each of the plurality of description blocks; (b) referring to a mode designation code that indicates the designated scheduling mode among the plurality of scheduling modes; (c) controlling such that scheduling of the behavioral level description is performed with respect to each of the plurality of description blocks in accordance with the designated scheduling mode indicated by the mode designation code; and (d) performing the scheduling in accordance with the controlling with reference to a resource quantity data indicating resource constraint and a resource delay data indicating delay times of respective resources.

In another exemplary aspect of the invention, a behavioral synthesis program recorded on a computer-readable medium, when executed, causes a computer to perform the above-mentioned behavioral synthesis method is provided.

In another exemplary aspect of the invention, a method of designing a circuit is provided. The method includes: (A) performing the above-mentioned behavioral synthesis method to generate a register transfer level description from the behavioral level description; and (B) designing the circuit based on the generated register transfer level description.

In another exemplary aspect of the invention, a method of manufacturing a circuit is provided. The method includes: (C) designing the circuit by the above-mentioned circuit design method; and (D) manufacturing the designed circuit.

According to the present invention, it is possible to perform behavioral synthesis with applying a plurality of scheduling modes to a single process described in the behavioral level.

BRIEF DESCRIPTION OF THE DRAWINGS

The above and other objects, advantages and features of the present invention will be more apparent from the following description of certain exemplary embodiments taken in conjunction with the accompanying drawings, in which:

FIG. 5A shows an example of a behavioral level description;

FIG. 5B is a first diagram showing a midstream of scheduling of the behavioral level description shown in FIG. 5A;

FIG. 5C is a second diagram showing a midstream of scheduling of the behavioral level description shown in FIG. 5A;

FIG. 5D is a diagram showing a result of scheduling of the behavioral level description shown in FIG. 5A;

FIG. 5E shows a comparative example;

EXEMPLARY EMBODIMENTS

Exemplary embodiments of the present invention will be described below with reference to the attached drawings.

First Exemplary Embodiment

Figure 1:
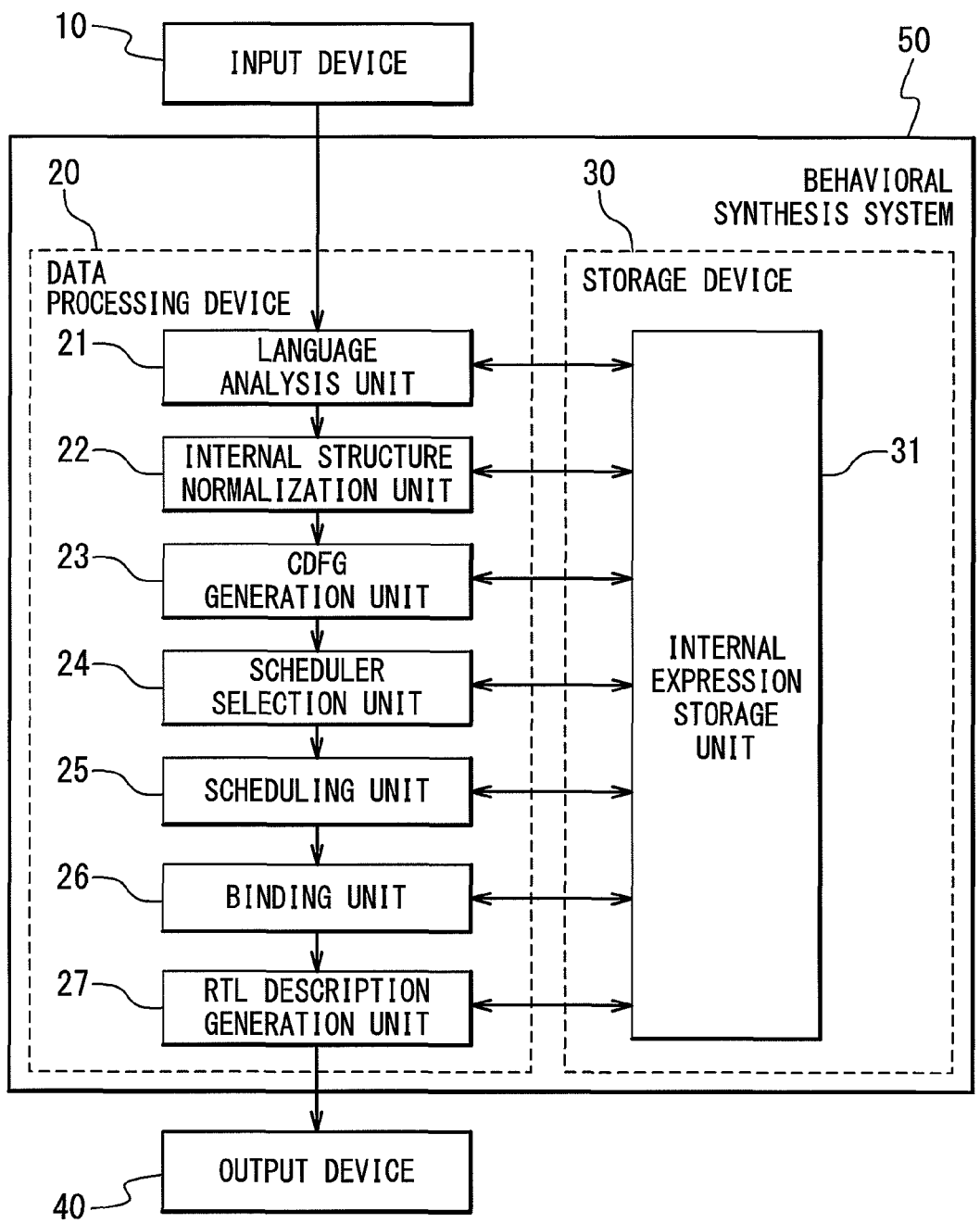
FIG. 1 is a block diagram showing a configuration of a behavioral synthesis system according to a first exemplary embodiment of the present invention.

FIG. 1 is a block diagram showing a configuration of a behavioral synthesis system according to a first exemplary embodiment of the present invention. The behavioral synthesis system 50 is provided with a data processing device 20 (also referred to as a computer, a central processing device, or a processor) which operates in accordance with a program control and a storage device 30 for storing data. The behavioral synthesis system 50 is connected to an input device 10 and an output device 40. The input device 10 is used by a user for inputting text data to create a behavioral level description file. The output device 40 is able to display contents of the behavioral level description file and an RT (Register Transfer) level description file.

The data processing device 20 includes functional blocks such as a language analysis unit 21, an internal structure normalization unit 22, a CDFG (Control Data Flow Graph) generation unit 23, a scheduler selection unit 24, a scheduling unit 25, a binding unit 26, and an RTL description generation unit 27. These functional blocks 21 to 27 are achieved by executing a behavioral synthesis program that is a computer program for the behavioral synthesis and may be recorded on a computer-readable recording medium. The respective functional blocks 21 to 27 operate as follows.

The language analysis unit 21 analyzes a behavioral level description file that is a target of the behavioral synthesis and converts the file into internal expression data. The internal structure normalization unit 22 normalizes the internal expression data by appropriately expanding portions associated with functions, loops and the like in the internal expression data supplied from the language analysis unit 21. The CDFG generation unit 23 converts the normalized internal expression data to generate a CDFG data.

The scheduler selection unit 24 (mode control unit) is provided with a plurality of scheduling engines which operate in a plurality of predetermined scheduling modes, respectively. In the present exemplary embodiment, a single process described in the behavioral level description file is divided into a plurality of description blocks (description ranges), and a scheduling mode among the plurality of scheduling modes is designated with respect to each of the plurality of description blocks. A code that indicates the designated scheduling mode among the plurality of scheduling modes is referred to as a "mode designation code". For example, each of the plurality of description blocks has the mode designation code. Alternatively, the mode designation code may be provided in such forms as a text description, an external file, a GUI and the like. With respect to each of the plurality of description blocks, the scheduler selection unit 24 refers to the above-described mode designation code and selects an appropriate scheduling engine that operates in the designated scheduling mode indicated by the mode designation code from the plurality of scheduling engines.

The scheduling unit 25 is provided with a resource quantity data indicating resource constraint and a resource delay data indicating delay times of respective resources. Referring to the resource quantity data and resource delay data, the scheduling unit 25 performs scheduling of the behavioral level description such that the resource constraint and timing constraint are met. According to the present exemplary embodiment, the scheduling unit 25 performs the scheduling with respect to each of the plurality of description blocks in accordance with the designated scheduling mode indicated by the mode designation code. More specifically, the scheduling unit 25 performs the scheduling by using the above-mentioned scheduling engine selected by the scheduler selection unit 24, with respect to each of the plurality of description blocks. In the scheduling, the scheduling unit 25 performs mapping of input-output and/or resource to clock cycles, based on the CDFG data generated by the CDFG generation unit 23. When the scheduling of a certain description block is completed, the selection processing by the scheduler selection unit 24 and the scheduling by the scheduling unit 25 are performed with respect to another description block.

The binding unit 26 binds resources such as calculation resources and memory resources, based on a scheduling result that is obtained through repetition of the scheduling by the scheduling unit 25. Based on a result of the binding by the binding unit 26, the RTL description generation unit 27 generates an RT level description file.

The respective functional blocks 21 to 27, as necessary, read and write data to an internal expression storage unit 31 included in the storage device 30 of the behavioral synthesis system 50.

Figure 2:
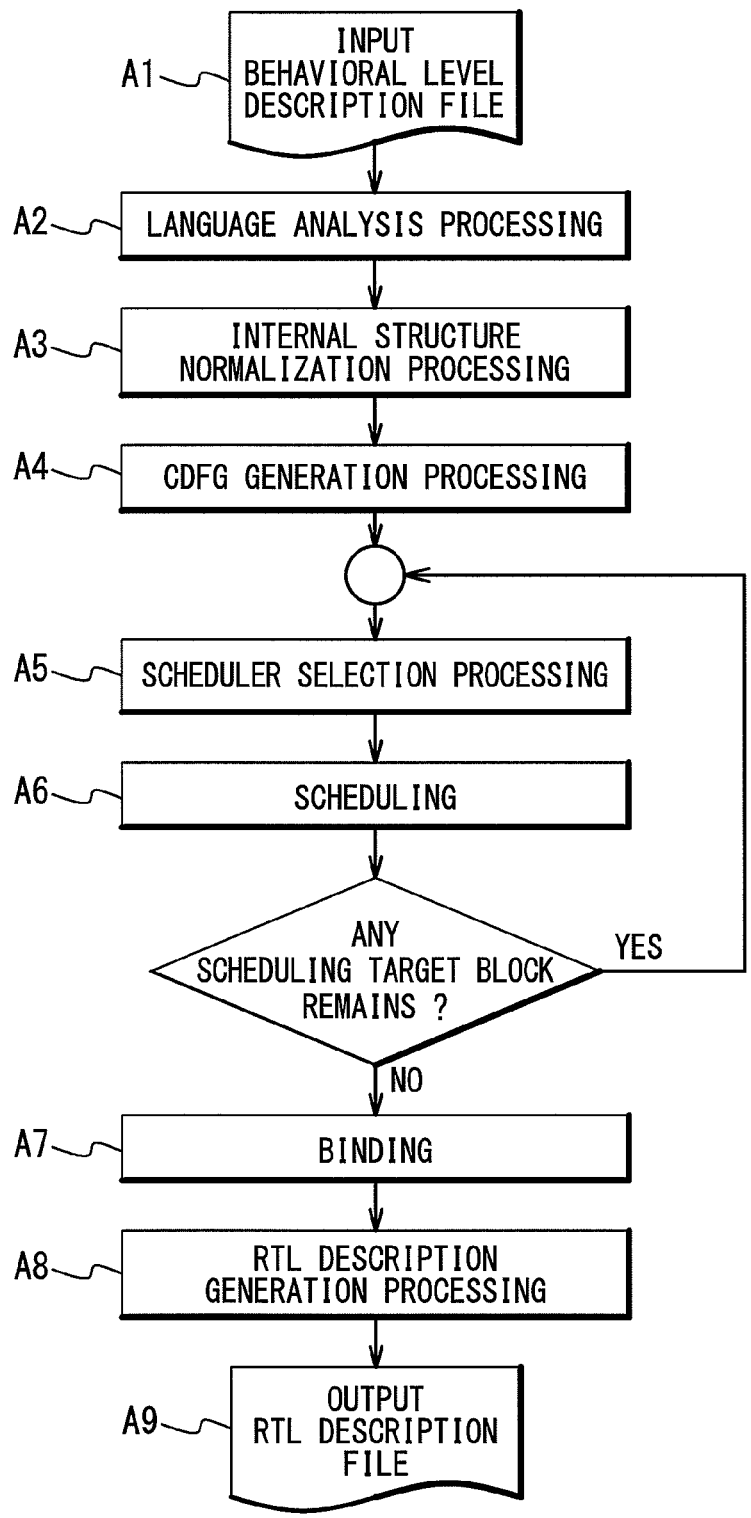
FIG. 2 is a flow chart showing an operation of the behavioral synthesis system according to the first exemplary embodiment.

Referring to a flow chart shown in FIG. 2, an operation of the behavioral synthesis system 50 will be explained below in more detail. First, a user prepares a behavioral level description file in which a highly abstract circuit specification is described in C language and the like. Here, let us consider a case where the behavioral level description file includes the mode designation code that indicates switching of the scheduling mode within a single process. (A1) The behavioral level description file is input to the behavioral synthesis system 50. The behavioral synthesis system 50 stores the input behavioral level description file in the storage device 30. (A2) Next, the language analysis unit 21 performs language analysis processing to convert the circuit data described in the behavioral level into the internal expression data for the behavioral synthesis. The internal expression data is expressed by a data structure such as AST (Abstract Syntax Tree). (A3) Next, the internal structure normalization unit 22 performs internal structure normalization processing on the internal expression data. (A4) Next, the CDFG generation unit 23 performs CDFG generation processing to generate the CDFG data.

Next, the scheduling is performed on the generated CDFG data. (A5) The scheduler selection unit 24 selects the appropriate scheduling engine with respect to each of the plurality of description blocks in accordance with the designated scheduling mode indicated by the mode designation code. (A6) The scheduling unit 25 performs the scheduling with respect to each of the plurality of description blocks by using the selected scheduling engine. The scheduler selection processing and the scheduling are repeated until the scheduling is completed for all of the behavioral level description.

In the scheduling with respect to a certain description block of the plurality of description blocks, the scheduling unit 25 performs mapping of nodes (input-output and/or a resource) to a certain clock cycle by using the scheduling engine. After that, the scheduling unit 25 performs the scheduling with respect to another description block. At this time, the scheduling unit 25 treats the nodes already mapped to the certain clock cycle as fixed. In other words, the scheduling unit 25 regards that the already-mapped nodes are fixed to the certain clock cycle. Meanwhile, the scheduling unit 25 is provided with the resource delay data indicating delay times of respective resources. If at least one resource preceding a new resource to be mapped is already mapped in the precedent scheduling, the scheduling unit 25 refers to the resource delay data to obtain the delay time of the already-mapped resource. In other words, the scheduling unit 25 calculates a delay time from a start of the certain clock cycle to the already-mapped resource with reference to the resource delay data. The scheduling unit 25 can regard the calculated delay time as an input delay of the new resource to be mapped. Therefore, the scheduling unit 25 calculates a residual time by subtracting the calculated delay time from one clock cycle. The residual time is timing constraint for the new resource, and the scheduling unit 25 performs mapping of the new resource within the range of the residual time. In other words, the scheduling unit 25 performs the scheduling such that the timing constraint depending on the residual time is met.

(A7) When the scheduling is completed for all of the behavioral level description, the binding unit 26 performs the binding. (A8) After that, the RTL description generation unit 27 performs RT level description generation processing. (A9) The behavioral synthesis system 50 outputs the generated RT level description file. The output device 40 can display contents of the generated RT level description file.

Effects of the first exemplary embodiment will be explained. According to the first exemplary embodiment, it is possible to switch the scheduling engine between the plurality of scheduling engines with respect to each description block included in a single process. Therefore, it is possible to perform the scheduling in different scheduling modes with respect to each description block included in a single process. At the time of switching of the scheduling engine, the scheduling unit 25 obtains a delay time of the already-mapped node. Then, the scheduling unit 25 uses the delay time as input delay constraint condition, when performing the scheduling with respect to the following description block. It is thus possible to perform the scheduling without terminating the current clock cycle and changing the clock cycle at the time when the scheduling engine is switched. As a result, a scheduling result in which the scheduling is performed with a fewer number of clock cycles can be obtained. Moreover, since the clock cycle need not be changed at the time when the scheduling engine is switched, it is possible to newly add a node to a clock cycle for which the scheduling is already completed as long as constraint on data dependency relationship is satisfied.

Second Exemplary Embodiment

Figure 3:
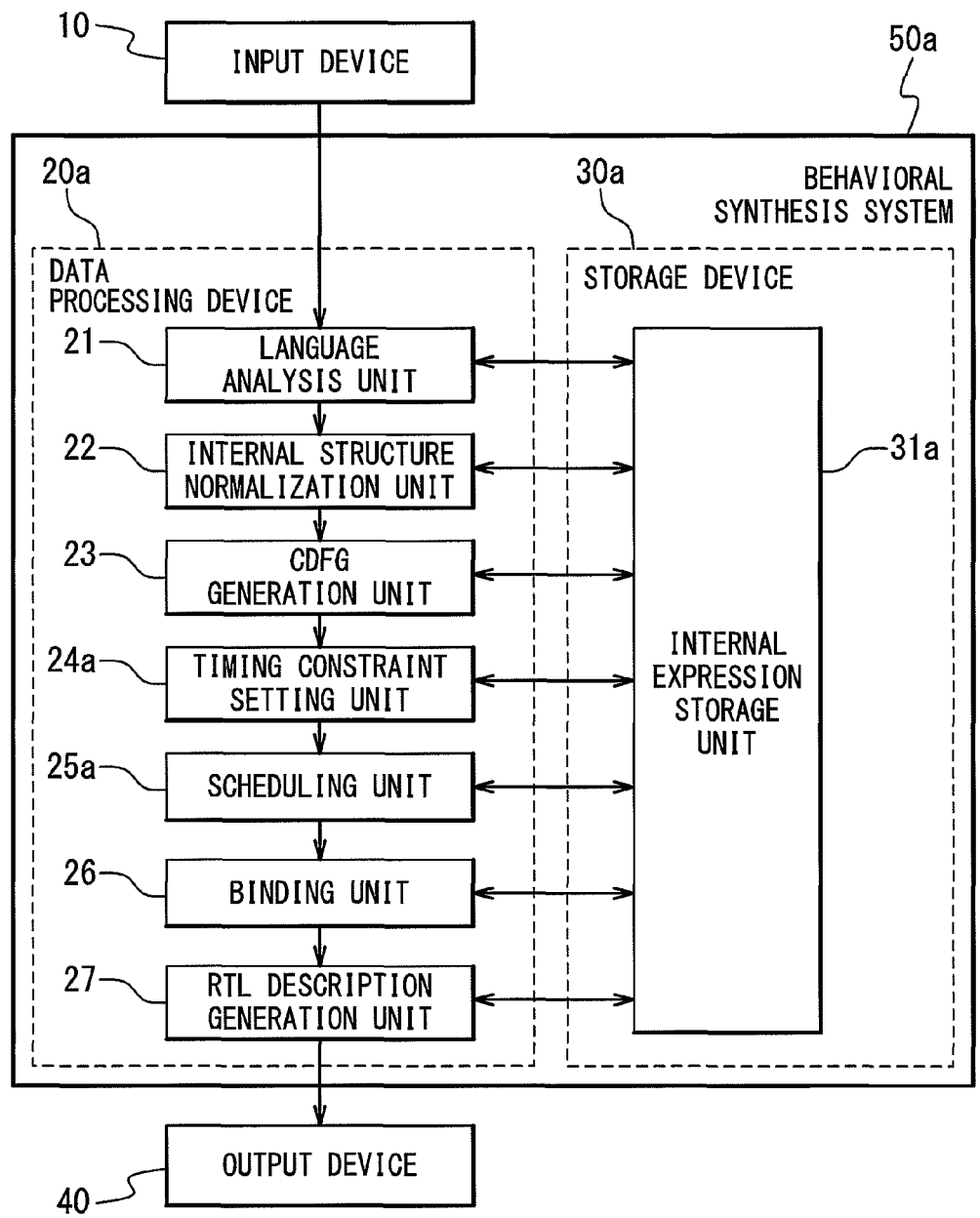
FIG. 3 is a block diagram showing a configuration of a behavioral synthesis system according to a second exemplary embodiment of the present invention.

FIG. 3 is a block diagram showing a configuration of a behavioral synthesis system according to a second exemplary embodiment of the present invention. The behavioral synthesis system 50a is provided with a data processing device 20a which operates in accordance with a program control and a storage device 30a for storing data. The data processing device 20a includes functional blocks such as the language analysis unit 21, the internal structure normalization unit 22, the CDFG generation unit 23, a timing constraint setting unit 24a, a scheduling unit 25a, the binding unit 26, and the RTL description generation unit 27. The language analysis unit 21, the internal structure normalization unit 22, the CDFG generation unit 23, the binding unit 26 and the RTL description generation unit 27 among them operate in the same manner as in the first exemplary embodiment, and are achieved by executing the behavioral synthesis program.

The timing constraint setting unit 24a (mode control unit) refers to the above-described mode designation code that indicates the designated scheduling mode with respect to each of the plurality of description blocks. Then, the timing constraint setting unit 24a automatically sets appropriate timing constraint such that a single scheduling engine can emulate all of user-intended scheduling modes for the plurality of description blocks. The scheduling unit 25a performs the scheduling of the behavioral level description such that the timing constraint set by the timing constraint setting unit 24a is met. Here, the scheduling unit 25a uses the above-mentioned single scheduling engine. In the scheduling, the scheduling unit 25a performs mapping of input-output and/or resource to clock cycles, based on the CDFG data generated by the CDFG generation unit 23. The timing constraint setting unit 24a and the scheduling unit 25a, as necessary, read and write data to an internal expression storage unit 31a included in the storage device 30a of the behavioral synthesis system 50a. Also, the timing constraint setting unit 24a and the scheduling unit 25a are achieved by executing the behavioral synthesis program.

Figure 4:
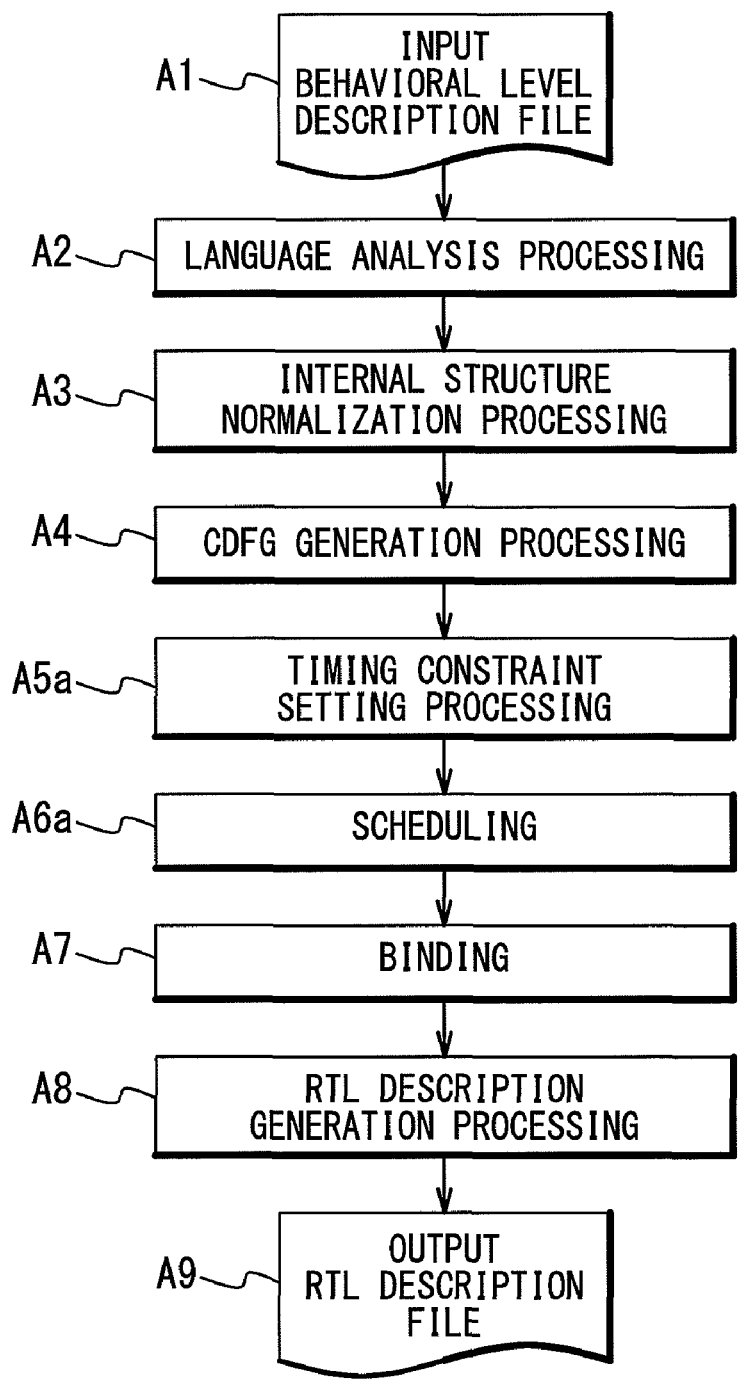
FIG. 4 is a flow chart showing an operation of the behavioral synthesis system according to the second exemplary embodiment.

Referring to a flow chart shown in FIG. 4, an operation of the behavioral synthesis system 50a will be explained below in more detail. In FIG. 4, the processing A1 to A4 and A7 to A9 are the same as those in the first exemplary embodiment shown in FIG. 2. When the CDFG data is generated by the CDFG generation processing (A4), the behavioral synthesis system 50a performs the scheduling based on the CDFG data. The scheduling in the second exemplary embodiment will be described below in detail.

(A5a) First, the timing constraint setting unit 24a performs timing constraint setting processing. Here, the timing constraint setting unit 24a sets appropriate timing constraint with reference to the above-described mode designation code. The timing constraint is set such that the scheduling unit 25a operates as if it performs the scheduling by using a plurality of scheduling engines although it actually uses a single scheduling engine. That is to say, setting of the timing constraint is changed in accordance with the designated scheduling mode with respect to each of the plurality of description blocks, such that meanings of the respective scheduling modes are satisfied. (A6a) The scheduling unit 25a performs the scheduling by using the single scheduling engine such that the timing constraint set by the timing constraint setting unit 24a is met. In order to meet the timing constraint, it is preferable to employ a scheduling engine having the highest degree of freedom as the single scheduling engine. Specifically, it is desirable to employ the single scheduling engine that operates in a scheduling mode that permits increase in a cycle boundary and permits input-output and a resource to cross over a cycle boundary.

Effects of the second exemplary embodiment will be explained. According to the second exemplary embodiment, it is possible to perform the scheduling in different scheduling modes with respect to each description block included in a single process, even though the single scheduling engine is used. Since the single scheduling engine is used, it is possible to perform the scheduling without terminating the current clock cycle and changing the clock cycle at the time when the scheduling mode is switched. As a result, a scheduling result in which the scheduling is performed with a fewer number of clock cycles can be obtained. Moreover, since the single scheduling engine is used, an overhead of switching the scheduling engine is eliminated, which improves execution efficiency. In addition, the behavioral synthesis system can be realized easily, because just the single scheduling engine is enough for the scheduling.

It should be noted that the scheduler selection unit 24 in the first exemplary embodiment or the timing constraint setting unit 24a in the second exemplary embodiment serves as a "mode control unit". The mode control unit (24, 24a) refers to the mode designation code and controls the scheduling such that the scheduling unit (25, 25a) performs the scheduling with respect to each description block in accordance with the designated scheduling mode indicated by the mode designation code.

According to the first and second exemplary embodiments, the RT level description file (circuit data described in the RT level) is generated. After the RT level description file is obtained, the logic synthesis is performed with respect to the RT level description file and thereby a gate-level netlist is generated. After that, cell placement, routing and the like are performed based on the gate-level netlist. Consequently, a layout data indicating a layout of an integrated circuit is generated. In this manner, the integrated circuit is designed based on the generated RT level description file. After that, the designed integrated circuit is manufactured based on the layout data.

Effects of the first and second exemplary embodiments will be explained from a user's point of view. The first effect is that the user can describe a portion with strict timing constraint such as an input-output protocol portion and a portion with relatively loose timing constraint such as an algorithm portion in a mixed manner with an identical process. The reason is that a scheduling mode with the high degree of scheduling freedom such as the superstate input-output mode and the free-floating mode can be employed for the algorithm portion while a scheduling mode with the low degree of scheduling freedom such as the cycle-fixed mode is employed only for the input-output protocol portion.

The second effect is that the user can easily designate constraint on the timing. Conventionally, when the timing constraint is designated in a case of a behavioral description having no concept of timing such as the C language, it is necessary to finely designate the timing for each sentence and calculation, which causes problems in describability and readability. According to the exemplary embodiments, however, the cycle-fixed scheduling and the like can be designated in a description block unit and thus the user can easily describe the constraint on the timing The third effect is that the user can control the scheduling result. When a scheduling mode with the high degree of scheduling freedom is used, ideal results that the user considers may not be obtained with regard to the number of clock cycles and the timings. In this case, the user can apply the cycle-fixed scheduling mode only to a specific portion. Consequently, the user can easily obtain the ideal scheduling result without spending time and effort.

Example 1

Next, an example of the scheduler selection processing A5 and the scheduling A6 in the first exemplary embodiment will be described in detail. FIG. 5A shows an example of the behavioral level description based on the SystemC syntax notation. A method ".read( )" means reading of a value from an input port, a method ".write( )" means writing of a value to an output port, and "wait( )" means a cycle boundary. The specification of the SystemC is disclosed at "http://www.systemc.org/".

FIG. 5A shows a part of a circuit data where a certain process is described in the behavioral level, and the certain process includes two description blocks. In FIG. 5A, a line of "#pragma scheduling_block" corresponds to the mode designation code for the behavioral synthesis system 50 and indicates a scheduling mode designated to a description block following this line. As for a cycle boundary, two scheduling modes can be considered: a mode that, when cycle boundaries are designated in the input behavioral level description, permits terminating cycles only at the designated cycle boundaries; and a mode that permits to increase the cycle boundary in addition to the designated cycle boundaries. On the other hand, as for a relationship between the cycle boundary and the input-output and the resource (e.g. a calculation resource and a memory resource), three scheduling modes can be considered: a mode that prohibits both the input-output and the resource to cross over the designated cycle boundary; a mode that permits only the resource to cross over the cycle boundary; and a mode that permits both the input-output and the resource to cross over the designated cycle boundary. Accordingly, six scheduling modes can be considered in all combination for the scheduling in the behavioral synthesis. Note here that a mode that permits increase in a cycle boundary and permits both the input-output and the resource to cross over the designated cycle boundary has little meaning because it only defines a lower limit of the number of cycles. For this reason, practically, five scheduling modes other than this combination may be handled.

That is to say, the following five scheduling modes are used. A first scheduling mode permits increase in a cycle boundary, prohibits input-output to cross over a cycle boundary and permits a resource to cross over a cycle boundary (e.g. (superstate, io) described later). A second scheduling mode permits increase in a cycle boundary and prohibits input-output and a resource to cross over a cycle boundary (e.g. (superstate, all)). A third scheduling mode prohibits increase in a cycle boundary and permits input-output and a resource to cross over a cycle boundary (e.g. (fixed, none)). A fourth scheduling mode prohibits increase in a cycle boundary, prohibits input-output to cross over a cycle boundary and permits a resource to cross over a cycle boundary (e.g. (fixed, io)). A fifth scheduling mode prohibits increase in a cycle boundary and prohibits input-output and a resource to cross over a cycle boundary (e.g. (fixed, all)).

In FIG. 5A, the pragma "scheduling_block" has two arguments, and one of the above-mentioned five scheduling modes can be designated by using the two arguments. The first argument is set to "fixed" or "superstate". The first argument means whether or not a cycle boundary can be automatically increased between cycle boundaries. If the first argument is set to "fixed", to increase in a cycle boundary between cycle boundaries is prohibited. On the other hand, if the first argument is set to "superstate", a cycle boundary can be freely increased. The second argument is set to any one of "none", "io" and "all". The second argument means the component that is prohibited from crossing over the cycle boundary indicated by the "wait( )". If the second argument is "none", both the input-output and the resource can cross over the cycle boundary. If the second argument is "io", the input-output cannot cross over the cycle boundary while the resource can cross over the cycle boundary. If the second argument is "all", neither the input-output nor the resource can cross over the cycle boundary.

In the case of FIG. 5A, the two arguments are set to (superstate, io) with regard to the main description block. The arguments (superstate, io) corresponds to the above-mentioned first scheduling mode among the plurality of scheduling modes. Therefore, the behavioral synthesis system 50 performs the scheduling in the first scheduling mode with respect to the main description block. On the other hand, the two arguments are set to (fixed, all) with regard to the sub description block. The arguments (fixed, all) corresponds to the fifth scheduling mode among the plurality of scheduling modes. Therefore, the behavioral synthesis system 50 performs the scheduling in the fifth scheduling mode with respect to the sub description block.

The scheduling unit 25 of the behavioral synthesis system 50 is provided with the resource quantity data indicating resource constraint and the resource delay data indicating delay times of respective resources. In the present example, the resource quantity data indicates that up to two adders and one multiplier can be used within one clock cycle. The resource delay data indicates that, when one clock cycle is "1", the adder can operate in "0.4" and the multiplier can operate in "0.7". The scheduling unit 25 in the present example is provided with the resource quantity data and resource delay data.

In this case, the behavioral synthesis system 50 operates as follows. First, the scheduler selection unit 24 refers to the mode designation code of the main description block in order to perform the scheduling with respect to the main description block. The scheduler selection unit 24 is provided with five scheduling engines which operate in the above-described five scheduling modes, respectively. Based on the designation (superstate, io), the scheduler selection unit 24 selects a scheduling engine which operates in the first scheduling mode corresponding to the designation (superstate, io). When entering into the main description block, the sub (internal) description block appears. Therefore, the scheduling unit 25 temporarily suspends the scheduling with respect to the main description block. Then, the scheduler selection unit 24 performs the scheduler selection processing A5 with respect to the sub description block. More specifically, the scheduler selection unit 24 refers to the mode designation code of the sub description block and selects a scheduling engine which operates in the fifth scheduling mode corresponding to the designation (fixed, all).

The scheduling unit 25 performs the scheduling with respect to the sub description block by using the selected scheduling engine corresponding to the (fixed, all). The scheduling unit 25 detects that a calculation (addition) "+1" exists at three points within the sub description block and these calculations are separated by the cycle boundary "wait( )". Also, the scheduling unit 25 refers to the resource quantity data and the resource delay data. Since the resource quantity data indicates that up to two adders can be used within the same clock cycle, the resource constraint is met. Moreover, since the resource delay data indicates that the calculation time by the adder is 0.4, the timing constraint is also met. Therefore, the scheduling unit 25 maps these three calculations "+1" to successive clock cycles each sandwiched between cycle boundaries. FIG. 5B shows a result of the scheduling with respect to the sub description block. In FIG. 5B, each of step1 to step5 means a clock cycle. In a data structure, information of the step is recorded so as to belong to a calculation node.

When the scheduling of the sub description block is completed, the processing returns back to the main description block, and the scheduling unit 25 resumes the suspended scheduling with respect to the main description block. The scheduling unit 25 uses the already selected scheduling engine corresponding to the (superstate, io). The scheduling unit 25 first sets "t1=data1+data2" as a scheduling target. Since the calculation "+" is allowed to cross over a cycle boundary in the current scheduling mode of (superstate, io), it is possible to map the calculation "+" to cross over a cycle boundary "wait( )". Whereas, there is a data dependency relationship that t1 cannot be calculated until values of data1 and data2 are determined. Due to the data dependency relationship, the scheduling of "t1=data1+data2" can be performed after data2 is calculated at the step4. The scheduling unit 25 checks whether or not "t1=data1+data2" can be added to the step4. Since the resource quantity data indicates that up to two adders can be used within the same clock cycle, the resource constraint is met. Also, the resource delay data indicates that the calculation time by the adder is 0.4, and a total delay time becomes 0.8 even when the second addition is performed, which satisfies the timing constraint. Therefore, the scheduling unit 25 maps "t1=data1+data2" as the second calculation at the step4.

Next, the scheduling unit 25 sets "t2=data2+data3" as a scheduling target. Due to a similar data dependency relation ship, the scheduling of "t2=data2+data3" can be performed after data3 is calculated at the step5. As in the case of the foregoing calculation of t1, it is confirmed that the resource constraint and the timing constraint are met. Therefore, the scheduling unit 25 maps "t2=data2+data3" to the step5. Subsequently, the scheduling unit 25 sets "t3=data3+data1" as a scheduling target. According to a data dependency relationship, the scheduling of "t3=data3+data1" can be performed after the step5. However, two adders are already used in the step5, which is the upper limit of the resource constraint indicated by the resource quantity data. For this reason, the scheduling unit 25 generates a new step6 and maps "t3=data3+data1" to the step6. A midstream of the scheduling to the description blocks is shown in FIG. 5C.

Next, the scheduling unit 25 sets "t1*t2" as a scheduling target. According to a data dependency relationship, the scheduling of "t1*t2" can be performed after the step5 where t2 is calculated. The scheduling unit 25 checks whether or not "t1*t2" can be mapped to the step5. The resource delay data indicates that the delay time of the adder is 0.4 and the delay time of the multiplier is 0.7. Currently, the total delay time at step5 is 0.8 due to the two "+". If a multiplication whose delay time is 0.7 is added to step5, the total delay time becomes 1.5 which exceeds one clock cycle. Consequently, the scheduling unit 25 confirms that it is not possible to schedule "t1*t2" to the step5. Next, the scheduling unit 25 checks whether or not "t1*t2" can be scheduled to the step6. The resource quantity data indicates that one multiplier can be used within one clock cycle. Since a multiplier is not yet used in the step6, the resource constraint is met. The resource delay data indicates that the delay time of the multiplier is 0.7. Moreover, since there is no data dependency relationship between the already-mapped "t3=data3+data1" and "t1*t2", the two calculations can be performed simultaneously in parallel. Therefore, the timing constraint is met. Consequently, the scheduling unit 25 maps "t1*t2" to the step6.

Next, the scheduling unit 25 sets a calculation "*t3" on the result of "t1*t2" as a scheduling target. According to a data dependency relationship, the scheduling of "*t3" can be performed after the step6 where "t1*t2" is calculated. The scheduling unit 25 checks whether or not "*t3" can be mapped to the step6. The resource quantity data indicates that one multiplier can be used within the same clock cycle. Since one multiplier is already used by "t1*t2" at the step6, the resource constraint is not satisfied if the second multiplication "*t3" is added. Moreover, if the second multiplication "*t3" is added, the total delay time becomes 1.4, which does not satisfy the timing constraint. Therefore, the scheduling unit 25 generates a new step7 and maps "*t3" to the step7. In this manner, the scheduling of the main description block is completed. FIG. 5D shows a final result of the scheduling. As described above, the scheduling unit 25 performs the scheduling such that the resource constraint and the timing constraint is met.

The scheduling result shown in FIG. 5D indicates an advantage of the first exemplary embodiment according to the present invention. An input sequence (a sequence of ".read( )") included in the sub description block to which the (fixed, all) is designated as shown in FIG. 5A is a fixed protocol (constraint condition). If different scheduling modes cannot be designated independently with respect to each description block, the behavioral synthesis system has to employ any one of the following two methods of scheduling. The first one is to perform the scheduling of all the description blocks by using the same scheduling mode (fixed, all). The second one is to divide the single process into two processes comprising: one process related to the portion of (fixed, all); and the other process related to the other portion.

The first method where all the description blocks are scheduled by using the same scheduling mode (fixed, all) will be explained as a comparative example. According to the behavioral level description shown in FIG. 5A, the sub description block is first processed, then t1, t2 and t3 are calculated sequentially, and thereafter the multiplication "t1*t2" and the multiplication "*t3" are performed. Since the total calculation time of those calculations exceeds one clock cycle, the user needs to additionally describe "wait( )" in the case of the scheduling mode (fixed, all). However, when the user desires to obtain a scheduling result with the small number of steps as in the case of FIG. 5D, the user needs to determine where to perform each calculation such as "data1+data2" and then create a behavioral level description by manually inserting wait( ) such that the determined result is reflected. In this case, the use needs to substantially rewrite the behavioral level description and cannot enjoy the advantage of the automatic scheduling by the behavioral synthesis system.

According to the second method, the single process needs to be divided into two processes. One process is related to a portion that is scheduled in the mode of (fixed, all). The other process is related to a portion that is scheduled in the mode of (superstate, io). In this case, the user needs to rewrite the behavioral level description in order to divide the process. Furthermore, the user needs to determine a communication method between the two processes. Also, it becomes difficult to share a resource (e.g. an adder in the example of FIG. 5A) between the two processes. Moreover, it becomes difficult to map a resource associated with the mode of (fixed, all) and a resource associated with the mode of (superstate, io) to the same one clock cycle (refer to the step4 and step5 in FIG. 5D).

FIG. 5E shows a scheduling result obtained by the above-described second method as an comparative example. In this case, two scheduling modes (fixed, all) and (superstate, io) are designated to the respective two processes separately, and a scheduling engine operating in the scheduling mode (fixed, all) and a scheduling engine operating in the scheduling mode (superstate, io) are respectively used in the scheduling of the two processes. Here, the clock cycle needs to be terminated at a time when the scheduling engine is switched. As shown in FIG. 5E, the scheduling engine is switched after a step5, and the clock cycle is terminated between the step5 and a next step6. As shown in FIG. 5E, this comparative example requires eight clock cycles in total. It should be noted that the first exemplary embodiment requires only seven clock cycles in total, as shown in FIG. 5D.

Example 2

Figure 6:
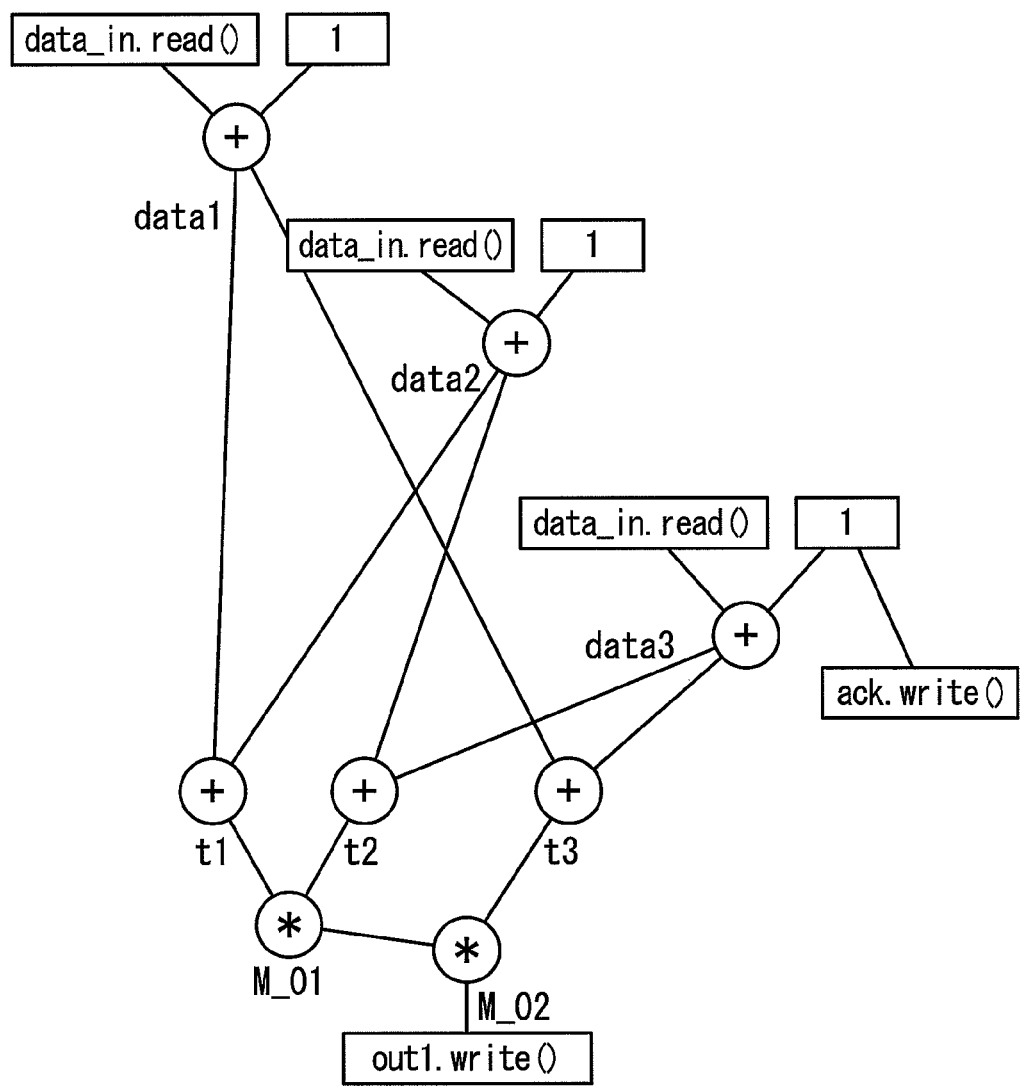
FIG. 6 is a CDFG (Control Data Flow Graph) showing a part of the behavioral level description shown in FIG. 5A.

Next, an example of the timing constraint setting processing A5a and the scheduling A6a in the second exemplary embodiment will be described in detail. Here, the behavioral level description shown in FIG. 5A is considered again. The example of the second exemplary embodiment will be explained based on the CDFG, instead of the text. FIG. 6 shows a CDFG representation of the behavioral level description shown in FIG. 5A. For simplicity, a portion corresponding to a "do-while" sentence in FIG. 5A is omitted from the data flow in FIG. 6, and only a portion after a step of obtaining a value ("data_in") is shown. In FIG. 6, an input-output node is represented by a rectangle and a resource node is represented by a circle.

The timing constraint setting unit 24a of the behavioral synthesis system 50a performs the timing constraint setting processing A5a with reference to the above-described mode designation code. If a mode designation code indicates a scheduling mode ("fixed") that prohibits increase in a cycle boundary, i.e., in a case of any of the above-described third, fourth and fifth scheduling modes, the timing constraint setting unit 24a generates a "cycle boundary line data" that fixes a cycle boundary. If a mode designation code indicates a scheduling mode ("superstate") that permits increase in a cycle boundary, i.e., in a case of any of the above-described first and second scheduling modes, the timing constraint setting unit 24a does not generate the cycle boundary line data. If a mode designation code indicates a scheduling mode ("io" or "all") that prohibits at least input-output to cross over a cycle boundary, i.e., in a case of any of the above-described first, second, fourth and fifth scheduling modes, the timing constraint setting unit 24a generates a "timing constraint data" that indicates timing constraint from a cycle boundary to the input-output. If a mode designation code indicates a scheduling mode ("all") that prohibits a resource to cross over a cycle boundary, i.e., in a case of any of the above-described second and fifth scheduling modes, the timing constraint setting unit 24a generates a timing constraint data that indicates timing constraint from a cycle boundary to the resource. If a mode designation code indicates a scheduling mode ("none") that permits input-output and a resource to cross over a cycle boundary, i.e., in a case of the third scheduling mode, the timing constraint setting unit 24a does not generate the timing constraint data.

In the case of FIG. 5A and FIG. 6, the timing constraint setting unit 24a first refers to the mode designation code with respect to three calculations "+1" in the upstream. The mode designation code indicates the fifth scheduling mode (fixed, all). Also, the three calculations "+1" are separated one after another by cycle boundaries "wait( )". Therefore, the timing constraint setting unit 24a generates the cycle boundary line data for fixing those cycle boundaries and adds the cycle boundary line data to the CDFG. Moreover, the timing constraint setting unit 24a adds a "timing constraint line data" to between the successive cycle boundaries fixed by the cycle boundary line data. Also, the timing constraint setting unit 24a adds a "timing constraint line data" to between a cycle boundary and a node (input-output and a resource). Then, the timing constraint setting unit 24a automatically generates the timing constraint data related to the timing constraint line data. The timing constraint data indicates timing constraint from the cycle boundary to the node (input-output and a resource) and is used for checking the timing constraint.

Subsequently, the timing constraint setting unit 24a refers to the mode designation code with respect to three calculations "+" and two calculations "*" in the downstream. The mode designation code indicates the first scheduling mode (superstate, io). Since the first argument is "superstate", the timing constraint setting unit 24a does not add the cycle boundary line data. On the other hand, since the second argument is "io", the timing constraint setting unit 24a adds the timing constraint line data only between the cycle boundary fixed by the cycle boundary line data and the "io" node. Then, the timing constraint setting unit 24a automatically generates the timing constraint data related to the timing constraint line data. Since the second argument is "io", the timing constraint setting unit 24a does not add the timing constraint line data with respect to the five resource nodes in the downstream.

Figure 7:
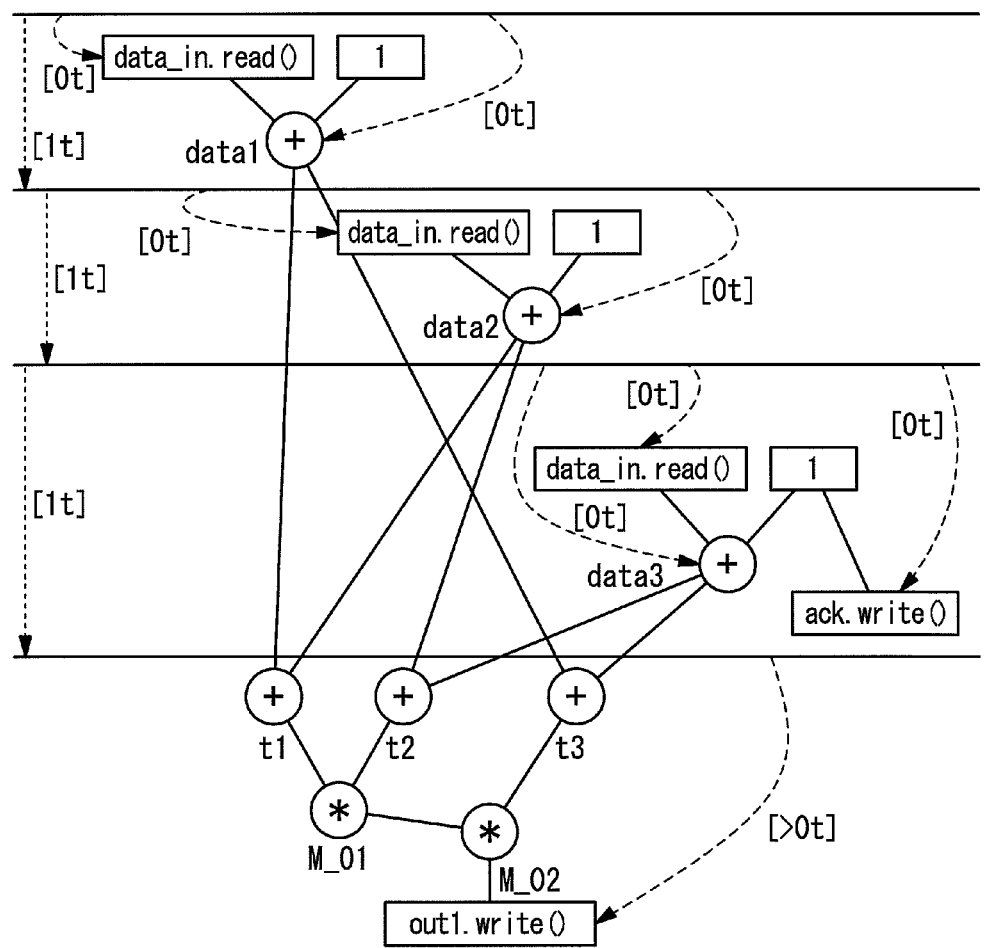
FIG. 7 is a diagram showing a result of timing constraint setting processing with respect to the CDFG shown in FIG. 6.

FIG. 7 shows the resultant CDFG after the timing constraint setting processing A5a is thus completed. In FIG. 7, a cycle boundary line representing the cycle boundary line data is shown by using a transverse thick line, and a timing constraint line representing the timing constraint line data is shown by using an arrowed broken line. The timing constraint data, which are represented by [0t], [1t] and [>0t], are added in relation to the respective timing constraint lines. The timing constraint data [0t] means that the timing constraint (delay time) from the cycle boundary to the node is determined and the timing constraint is set to "0 clock cycle". The timing constraint data [1t] means that the timing constraint (delay time) between the cycle boundaries is determined and the timing constraint is set to "1 clock cycle". The timing constraint data [>0t] means that the timing constraint (delay time) from the cycle boundary to the node is variable and adjustable and the timing constraint is set to equal to or more than "0 clock cycle" (for example, the timing constraint can be "0 clock cycle" or "1 clock cycle"). In the data structure, each node is expressed by a data block and respective data blocks are connected with each other by using pointers and the like in accordance with the connection relationship. Each data block includes a timing data indicating between which cycle boundaries the corresponding node exists and a delay time data indicating the timing constraint from the cycle boundary.

Figure 8:
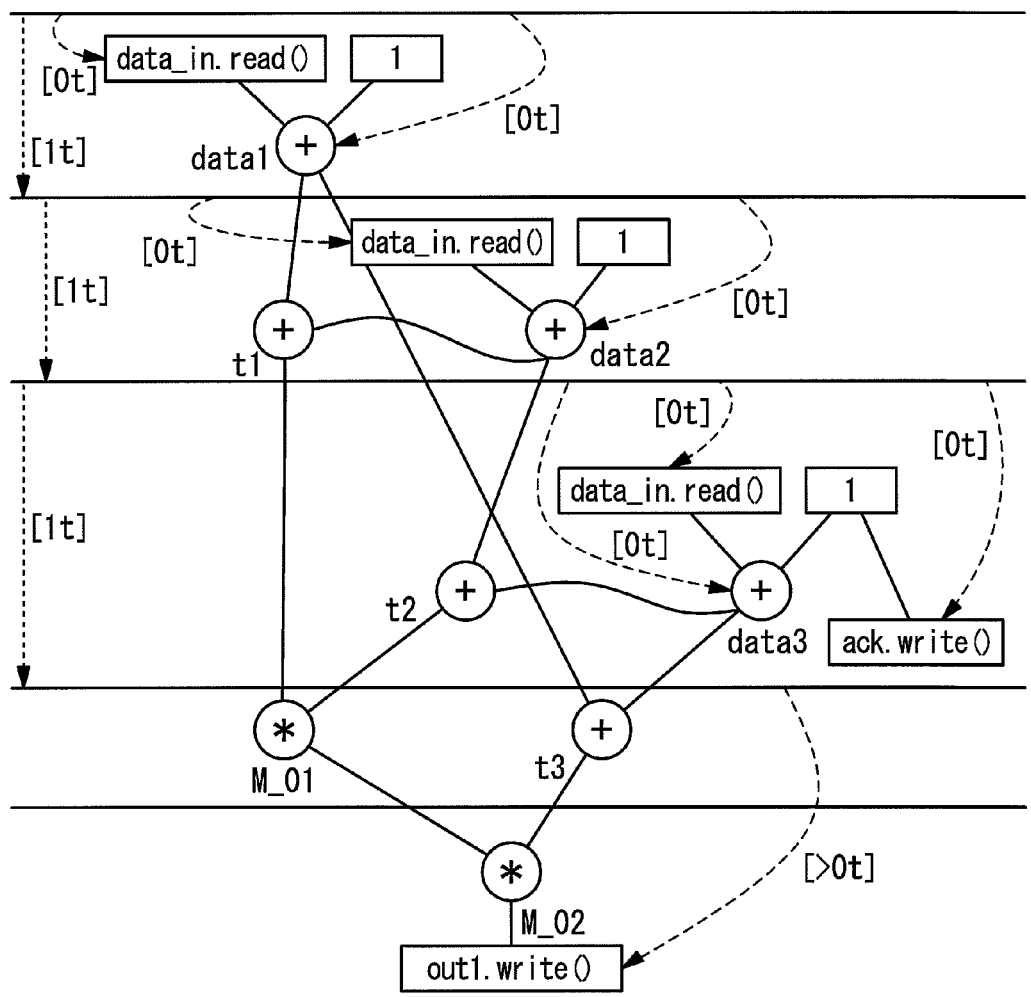
FIG. 8 is a diagram showing a result of scheduling based on FIG. 7.

After the timing constraint setting processing A5a is completed, the scheduling unit 25a performs the scheduling on the basis of the CDFG shown in FIG. 7. The scheduling unit 25a of the behavioral synthesis system 50a is provided with the resource quantity data indicating the resource constraint and the resource delay data indicating the delay times of respective resources, as in the case of the Example 1 of the first exemplary embodiment. Moreover, as can be easily understood from the CDFG shown in FIG. 7, the CDFG includes information about the scheduling mode. Therefore, the scheduling unit 25a can perform the scheduling with reference to the resource quantity data, the resource delay data, the cycle boundary line data and the timing constraint data, such that the resource constraint and the timing constraint are met as in the case of the Example 1. Specifically, the scheduling unit 25a performs the scheduling of five resource nodes and one input-output node whose delay times are not yet determined. Consequently, one cycle boundary line is added and then a CDFG as shown in FIG. 8 is obtained. The CDFG in FIG. 8 represents the same contents as the scheduling result shown in FIG. 5D. As described above, the same scheduling result can be obtained by performing the timing constraint setting processing A5a even when the single scheduling engine is used.

The setting of the timing constraint data is as follows. In a case where the first argument of the mode designation code is "fixed" (i.e., the third, fourth and fifth scheduling modes), the timing constraint data of [1t] is set to between the cycle boundaries. In a case where the first argument is "superstate" (i.e., the first and second scheduling modes), the timing constraint data of [1t] is not set to between the cycle boundaries. In a case where the second argument of the mode designation code is "all", the timing constraint data is set with respect to all the input-output nodes and resource nodes existing between a cycle boundary and the following cycle boundary. In this case, the timing constraint data is set to [0t] if the first argument is "fixed" (i.e., the fifth scheduling mode), while the timing constraint data is set to [>0t] if the first argument is "superstate" (i.e., the second scheduling mode). In a case where the second argument is "io", the timing constraint data is set with respect to only the input-output nodes between a cycle boundary and the following cycle boundary. Similarly, the timing constraint data is set to [0t] if the first argument is "fixed" (i.e., the fourth scheduling mode), while the timing constraint data is set to [>0t] if the first argument is "superstate" (i.e., the first scheduling mode). In a case where the second argument is "none", no timing constraint data is set with respect to the input-output nodes and the resource nodes. Consequently, it is possible to perform the scheduling by using the single scheduling engine, even when a certain process is described by combining complex description blocks.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A behavioral synthesis system comprising:
    a scheduling unit configured to perform scheduling of a behavioral level description with reference to a resource quantity data indicating resource constraint and a resource delay data indicating delay times of respective resources, wherein a single process described in said behavioral level description is divided into a plurality of description blocks and a scheduling mode among a plurality of scheduling modes is designated with respect to each of said plurality of description blocks; and
    a mode control unit configured to refer to a mode designation code that indicates said designated scheduling mode among said plurality of scheduling modes and to control such that said scheduling unit performs said scheduling with respect to each of said plurality of description blocks in accordance with said designated scheduling mode indicated by said mode designation code;
    wherein said plurality of scheduling modes include:
    a first scheduling mode that permits increase in a cycle boundary, prohibits input-output to cross over a cycle boundary and permits a resource to cross over a cycle boundary;

a second scheduling mode that permits increase in a cycle boundary and prohibits input-output and a resource to cross over a cycle boundary;
a third scheduling mode that prohibits increase in a cycle boundary and permits input-output and a resource to cross over a cycle boundary;
a fourth scheduling mode that prohibits increase in a cycle boundary, prohibits input-output to cross over a cycle boundary and permits a resource to cross over a cycle boundary; and
a fifth scheduling mode that prohibits increase in a cycle boundary and prohibits input-output and a resource to cross over a cycle boundary.

2. The behavioral synthesis system according to claim 1,
wherein when said mode designation code indicates any of said third scheduling mode, said fourth scheduling mode and said fifth scheduling mode, said mode control unit generates a cycle boundary line data that fixes a cycle boundary,
wherein when said mode designation code indicates any of said first scheduling mode, said second scheduling mode, said fourth scheduling mode and said fifth scheduling mode, said mode control unit generates a timing constraint data that indicates timing constraint from a cycle boundary to input-output,
wherein when said mode designation code indicates any of said second scheduling mode and said fifth scheduling mode, said mode control unit generates a timing constraint data that indicates timing constraint from a cycle boundary to a resource, and
wherein said scheduling unit refers to said resource quantity data, said resource delay data, said cycle boundary line data and said timing constraint data, and performs said scheduling such that said resource constraint and said timing constraint are met.

3. The behavioral synthesis system according to claim 2,
wherein when said mode designation code indicates any of said first scheduling mode and said second scheduling mode, said timing constraint is set to equal to or more than 0 clock cycle, and
wherein when said mode designation code indicates any of said fourth scheduling mode and said fifth scheduling mode, said timing constraint is set to 0 clock cycle.

4. The behavioral synthesis system according to claim 3,
wherein said scheduling unit performs said scheduling by using a single scheduling engine that operates in a scheduling mode that permits increase in a cycle boundary and permits input-output and a resource to cross over a cycle boundary.

5. The behavioral synthesis system according to claim 1,
wherein said mode control unit comprises a plurality of scheduling engines that operate in said plurality of scheduling modes, respectively,
wherein said mode control unit selects a scheduling engine from said plurality of scheduling engines with respect to each of said plurality of description blocks, said selected scheduling engine operating in said designated scheduling mode indicated by said mode designation code, and
wherein said scheduling unit performs said scheduling by using said selected scheduling engine with respect to each of said plurality of description blocks.

6. The behavioral synthesis system according to claim 5,
wherein said plurality of description blocks include a first description block and a second description block,
wherein in said scheduling with respect to said first description block, said scheduling unit performs mapping of a resource to a certain clock cycle,
wherein in said scheduling with respect to said second description block after said first description block, said scheduling unit calculates a delay time from a start of said certain clock cycle to said mapped resource with reference to said resource delay data, calculates a residual time by subtracting said calculated delay time from one clock cycle, and performs said scheduling such that timing constraint depending on said calculated residual time is met.

7. A behavioral synthesis method comprising:
storing, by using a computer, a behavioral level description in a storage device, wherein a single process described in said behavioral level description is divided into a plurality of description blocks and a scheduling mode among a plurality of scheduling modes is designated with respect to each of said plurality of description blocks;
referring, by using a computer, to a mode designation code that indicates said designated scheduling mode among said plurality of scheduling modes;
controlling, by using a computer, such that scheduling of said behavioral level description is performed with respect to each of said plurality of description blocks in accordance with said designated scheduling mode indicated by said mode designation code; and
performing, by using a computer, said scheduling in accordance with said controlling with reference to a resource quantity data indicating resource constraint and a resource delay data indicating delay times of respective resources;
wherein said plurality of scheduling modes include:
a first scheduling mode that permits increase in a cycle boundary, prohibits input-output to cross over a cycle boundary and permits a resource to cross over a cycle boundary;
a second scheduling mode that permits increase in a cycle boundary and prohibits input-output and a resource to cross over a cycle boundary;
a third scheduling mode that prohibits increase in a cycle boundary and permits input-output and a resource to cross over a cycle boundary;
a fourth scheduling mode that prohibits increase in a cycle boundary, prohibits input-output to cross over a cycle boundary and permits a resource to cross over a cycle boundary; and
a fifth scheduling mode that prohibits increase in a cycle boundary and prohibits input-output and a resource to cross over a cycle boundary.

8. The behavioral synthesis method according to claim 7,
wherein said controlling comprises:
generating a cycle boundary line data that fixes a cycle boundary, when said mode designation code indicates any of said third scheduling mode, said fourth scheduling mode and said fifth scheduling mode;
generating a timing constraint data that indicates timing constraint from a cycle boundary to input-output, when said mode designation code indicates any of said first scheduling mode, said second scheduling mode, said fourth scheduling mode and said fifth scheduling mode; and
generating a timing constraint data that indicates timing constraint from a cycle boundary to a resource, when said mode designation code indicates any of said second scheduling mode and said fifth scheduling mode,
wherein said performing said scheduling comprises:
referring to said resource quantity data, said resource delay data, said cycle boundary line data and said timing constraint data; and performing said scheduling such that said resource constraint and said timing constraint are met.

9. The behavioral synthesis method according to claim 8,
wherein when said mode designation code indicates any of said first scheduling mode and said second scheduling mode, said timing constraint is set to equal to or more than 0 clock cycle, and
wherein when said mode designation code indicates any of said fourth scheduling mode and said fifth scheduling mode, said timing constraint is set to 0 clock cycle.

10. The behavioral synthesis method according to claim 9,
wherein said performing said scheduling comprises: performing said scheduling by using a single scheduling engine that operates in a scheduling mode that permits increase in a cycle boundary and permits input-output and a resource to cross over a cycle boundary.

11. The behavioral synthesis method according to claim 7,
wherein a plurality of scheduling engines operate in said plurality of scheduling modes, respectively,
wherein said controlling comprises: selecting a scheduling engine from said plurality of scheduling engines with respect to each of said plurality of description blocks, said selected scheduling engine operating in said designated scheduling mode indicated by said mode designation code,
wherein said performing said scheduling comprises: performing said scheduling by using said selected scheduling engine with respect to each of said plurality of description blocks.

12. A behavioral synthesis program recorded on a non-transitory computer-readable medium, when executed, causes a computer to perform a behavioral synthesis method comprising:
storing a behavioral level description in a storage device, wherein a single process described in said behavioral level description is divided into a plurality of description blocks and a scheduling mode among a plurality of scheduling modes is designated with respect to each of said plurality of description blocks;
referring to a mode designation code that indicates said designated scheduling mode among said plurality of scheduling modes;
controlling such that scheduling of said behavioral level description is performed with respect to each of said plurality of description blocks in accordance with said designated scheduling mode indicated by said mode designation code; and
performing said scheduling in accordance with said controlling with reference to a resource quantity data indicating resource constraint and a resource delay data indicating delay times of respective resources;
wherein said plurality of scheduling modes include:
a first scheduling mode that permits increase in a cycle boundary, prohibits input-output to cross over a cycle boundary and permits a resource to cross over a cycle boundary;
a second scheduling mode that permits increase in a cycle boundary and prohibits input-output and a resource to cross over a cycle boundary;
a third scheduling mode that prohibits increase in a cycle boundary and permits input-output and a resource to cross over a cycle boundary;
a fourth scheduling mode that prohibits increase in a cycle boundary, prohibits input-output to cross over a cycle boundary and permits a resource to cross over a cycle boundary; and
a fifth scheduling mode that prohibits increase in a cycle boundary and prohibits input-output and a resource to cross over a cycle boundary.

13. The behavioral synthesis program according to claim 12,
wherein said controlling comprises:
generating a cycle boundary line data that fixes a cycle boundary, when said mode designation code indicates any of said third scheduling mode, said fourth scheduling mode and said fifth scheduling mode;
generating a timing constraint data that indicates timing constraint from a cycle boundary to input-output, when said mode designation code indicates any of said first scheduling mode, said second scheduling mode, said fourth scheduling mode and said fifth scheduling mode; and
generating a timing constraint data that indicates timing constraint from a cycle boundary to a resource, when said mode designation code indicates any of said second scheduling mode and said fifth scheduling mode,
wherein said performing said scheduling comprises:
referring to said resource quantity data, said resource delay data, said cycle boundary line data and said timing constraint data; and
performing said scheduling such that said resource constraint and said timing constraint are met.

14. The behavioral synthesis program according to claim 13,
wherein when said mode designation code indicates any of said first scheduling mode and said second scheduling mode, said timing constraint is set to equal to or more than 0 clock cycle, and
wherein when said mode designation code indicates any of said fourth scheduling mode and said fifth scheduling mode, said timing constraint is set to 0 clock cycle.

15. The behavioral synthesis program according to claim 14,
wherein said performing said scheduling comprises: performing said scheduling by using a single scheduling engine that operates in a scheduling mode that permits increase in a cycle boundary and permits input-output and a resource to cross over a cycle boundary.

16. The behavioral synthesis program according to claim 12,
wherein a plurality of scheduling engines operate in said plurality of scheduling modes, respectively,
wherein said controlling comprises: selecting a scheduling engine from said plurality of scheduling engines with respect to each of said plurality of description blocks, said selected scheduling engine operating in said designated scheduling mode indicated by said mode designation code,
wherein said performing said scheduling comprises: performing said scheduling by using said selected scheduling engine with respect to each of said plurality of description blocks.

* * * * *

UNITED STATES PATENT AND TRADEMARK OFFICE
CERTIFICATE OF CORRECTION

| | | |
|---|---|---|
| PATENT NO. | : 8,056,030 B2 | Page 1 of 1 |
| APPLICATION NO. | : 12/277728 | |
| DATED | : November 8, 2011 | |
| INVENTOR(S) | : Shinichi Noda and Hiroshi Akashio | |

It is certified that error appears in the above-identified patent and that said Letters Patent is hereby corrected as shown below:

On the title page item (73), Assignee: Delete "Information" and insert -- Informatec --

In the Specification

Column 8, Line 13: After "boundary." delete "The specification of the SystemC is disclosed at http://www.systemc.org/"

Signed and Sealed this
Fifteenth Day of July, 2014

Michelle K. Lee
*Deputy Director of the United States Patent and Trademark Office*